US 6,691,718 B2

(12) United States Patent
Bexten et al.

(10) Patent No.: US 6,691,718 B2
(45) Date of Patent: Feb. 17, 2004

(54) WAFER CONTAINER CLEANING SYSTEM

(75) Inventors: Dan Bexten, Kalispell, MT (US); Jerry Norby, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 76 days.

(21) Appl. No.: 10/108,278

(22) Filed: Mar. 26, 2002

(65) Prior Publication Data

US 2002/0096202 A1 Jul. 25, 2002

Related U.S. Application Data

(63) Continuation-in-part of application No. 09/611,642, filed on Jul. 7, 2000, now Pat. No. 6,412,502, which is a continuation-in-part of application No. 09/362,157, filed on Jul. 28, 1999, now Pat. No. 6,322,633.

(51) Int. Cl.[7] .................................. B08B 3/02
(52) U.S. Cl. .................. 134/80; 134/140; 134/152; 134/153; 134/157; 134/166 R
(58) Field of Search ................. 134/61, 78, 80, 134/133, 134, 140, 149, 152, 153, 157, 166 R, 169 R, 170, 200

(56) References Cited

U.S. PATENT DOCUMENTS

| | | | |
|---|---|---|---|
| 4,437,479 A | * | 3/1984 | Bardina et al. |
| 5,224,503 A | * | 7/1993 | Thompson et al. |
| 5,261,431 A | * | 11/1993 | Ueno et al. |
| 5,301,700 A | * | 4/1994 | Kamikawa et al. |
| 5,660,585 A | * | 8/1997 | Swoboda et al. |
| 5,738,128 A | * | 4/1998 | Thompson et al. |
| 6,039,057 A | * | 3/2000 | Doran |
| 6,248,177 B1 | * | 6/2001 | Halbmaier |
| 6,267,123 B1 | * | 7/2001 | Yoshikawa et al. |
| 6,422,247 B2 | * | 7/2002 | Yoshikawa et al. |

FOREIGN PATENT DOCUMENTS

| | | | |
|---|---|---|---|
| JP | 61-58238 | * | 3/1986 |
| JP | 61-164225 | * | 7/1986 |
| JP | 61-166134 | * | 7/1986 |

* cited by examiner

Primary Examiner—Frankie L. Stinson
(74) Attorney, Agent, or Firm—Perkins Coie LLP

(57) ABSTRACT

A system and method for cleaning carriers used for handling semiconductor wafers including a box cleaner having a rotor within an enclosure. Box holder assemblies on the rotor include upper and lower hooks for securing boxes to the rotor. A box door holder assembly is also provided on the rotor. The box door holder assembly preferably has a plurality of box door holding positions. Each box door holding position advantageously has a door guide and door hooks for holding a door. The box door holder assembly allows both the boxes and their doors to be cleaned with the centrifugal cleaner, avoiding the need for separate cleaning of the doors. In one configuration, the rotor is provided with an even number of box holder assemblies symmetrically spaced about the rotor and an even number of door holder assemblies symmetrically spaced about the rotor.

19 Claims, 6 Drawing Sheets

WAFER CONTAINER CLEANING SYSTEM

This application is a continuation-in-part of Ser. No. 09/611,642 filed Jul. 7, 2000 and now U.S. Pat. No. 6,412,502, which is a continuation-in-part of Ser. No. 09/362,157, filed Jul. 28, 1999, now U.S. Pat. No. 6,322,633 each of these applications incorporated herein by reference.

BACKGROUND OF THE INVENTION

The field of the invention relates to cleaning apparatus for cleaning carriers used to hold and process semiconductor wafers, substrates, flat panel displays and similar flat articles requiring low contamination levels.

The processing of semiconductor wafers, substrates, photomasks, flat panel displays, data disks, optical media and other articles relating to the semiconductor industry (collectively referred to here as "wafers") is very sensitive to problems of contamination. These articles require extremely low contamination levels. Even microscopic contaminants can cause defects. Accordingly, it is necessary to maintain a high level of cleanliness during virtually all stages of manufacture.

Semiconductor wafers are typically processed in batches. Batch handling may occur throughout the entire production process, or for one or more processing steps or related handling operations. Batch processing almost always uses some type of carrier to hold the wafers. The wafer carriers can be of various designs. Carriers in the form of a protective case or box are often used. In these types of carriers, the wafers are held and enclosed against contamination during travel within the processing facility. The wafer carriers must be cleaned, to avoid having particles and contaminants on the carriers contaminate the wafers. However, cleaning carriers or boxes can he difficult due to their size and shape, and because they may have features such as slots, grooves or apertures.

Box carriers have been successfully cleaned in centrifugal cleaners. See, for example, U.S. Pat. No. 5,738,128, incorporated herein by reference. In these centrifugal cleaners, the box is loaded onto a rotor, with the open top or front side of the box facing radially outwardly from the rotor. The box is sprayed with cleaning fluids, and then with drying gases, while the rotor turns. Centrifugal force helps to remove cleaning fluids from the box and to help dry it.

Ease of loading and unloading boxes, and their doors into and out of the rotor, and maintaining the rotor in balance under various conditions, remain as engineering challenges.

SUMMARY OF THE INVENTION

In a first aspect of the invention, a system for cleaning carriers used for handling wafers includes a box cleaner having a rotor within an enclosure. Box holder assemblies on the rotor include upper and lower hooks for securing boxes to the rotor. A box door holder assembly is also provided on the rotor. The box door holder assembly preferably has a plurality of box door holding positions. Each box door holding position advantageously has a door guide and door hooks for holding a door. The box door holder assembly allows both the boxes and their doors to be cleaned with the centrifugal cleaner, avoiding the need for separate cleaning of the doors.

In a second and separate aspect, the rotor is provided with an even number of box holder assemblies symmetrically spaced about the rotor and an even number of door holder assemblies symmetrically spaced about the rotor. This helps to allow the rotor to avoid out of balance conditions Other and further objects, inventive features, and advantages, will appear hereinafter. The invention resides as well in subcombinations of the features described.

BRIEF DESCRIPTION OF THE DRAWINGS

In the drawings, wherein the same reference number denotes the same element, throughout the several views.

DETAILED DESCRIPTION OF THE DRAWINGS

Figure 1:
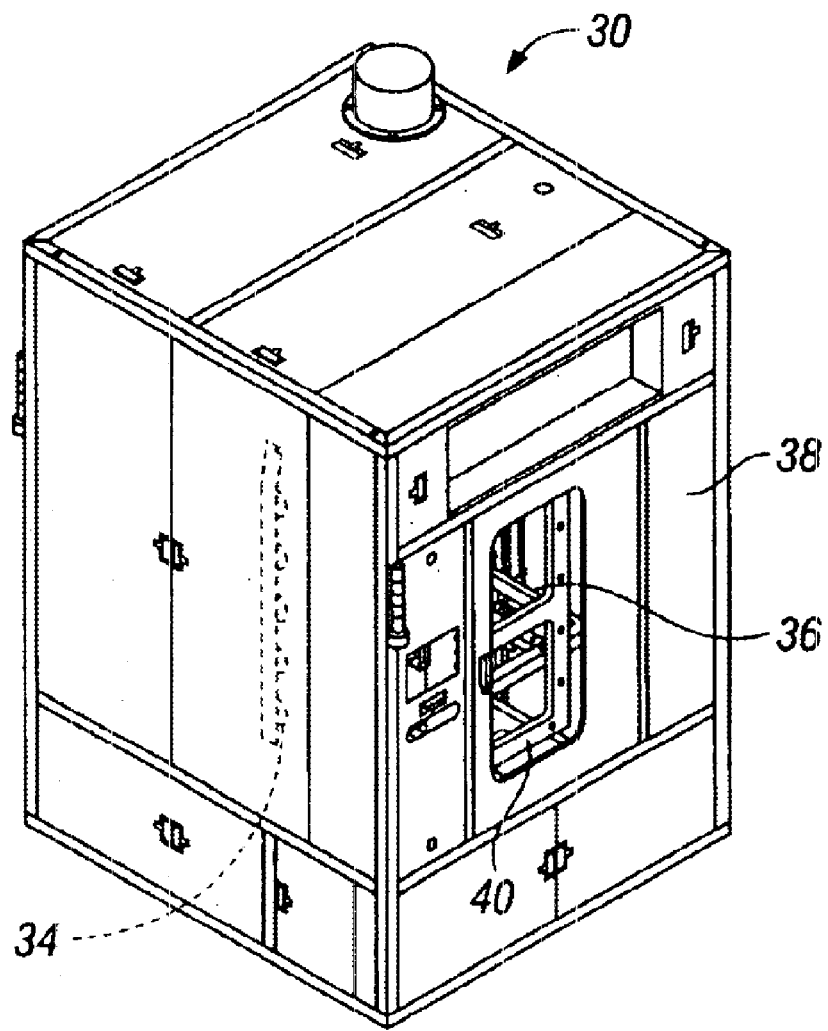
FIG. 1 is a perspective view of a centrifugal cleaning system.

Turning now in detail to the drawings, as shown in FIG. 1, a carrier cleaning system 30 includes a rotor assembly 36 rotatably supported within an enclosure 38. The rotor assembly 36 is accessed via an enclosure door 40. Nozzles 34 or outlasts spray cleaning and/or drying liquids and gases towards boxes and box doors held in the rotor assembly 36.

Figure 2:
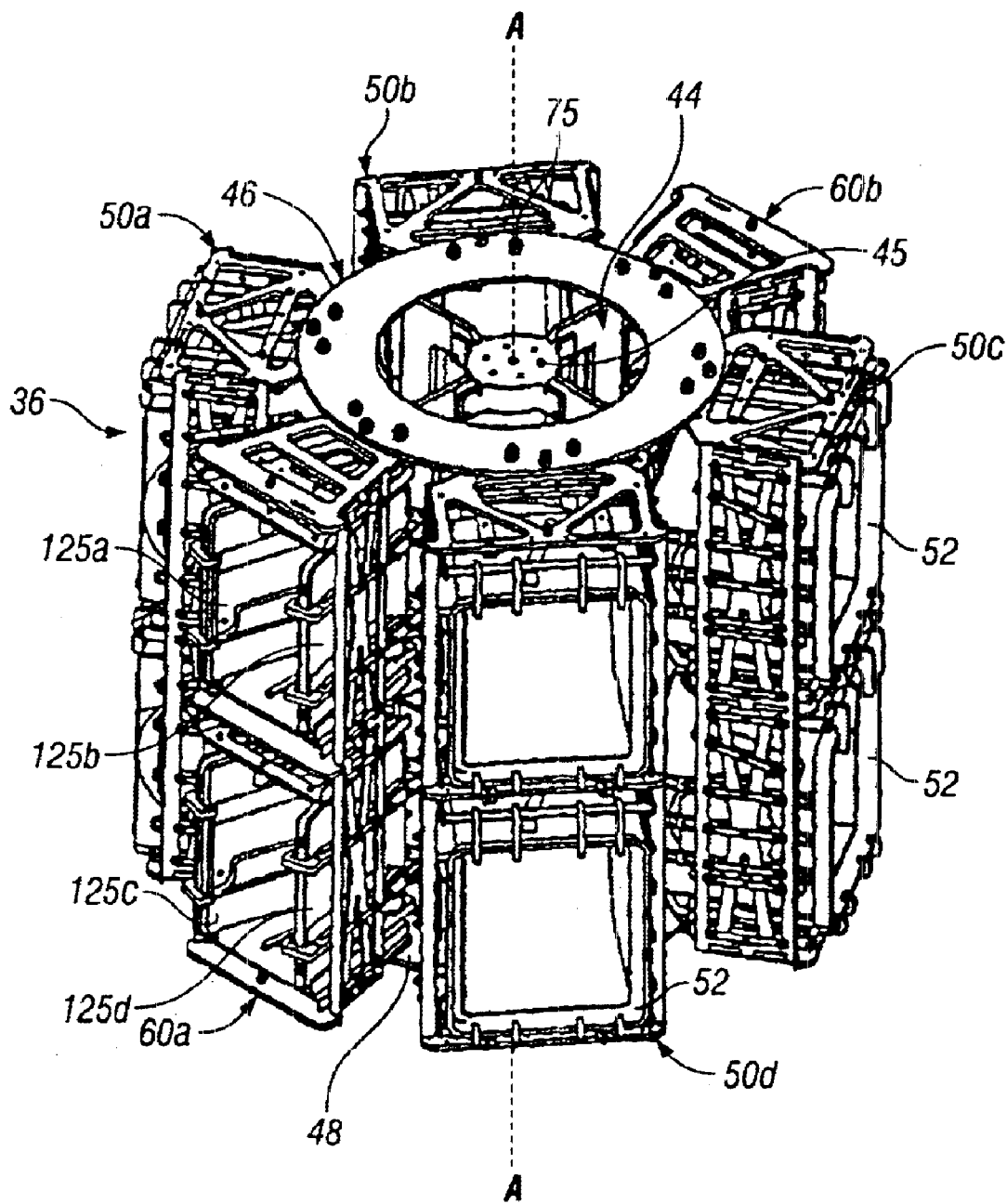
FIG. 2 is a perspective view of a rotor within the cleaning system shown in FIG. 1.
Figure 3:
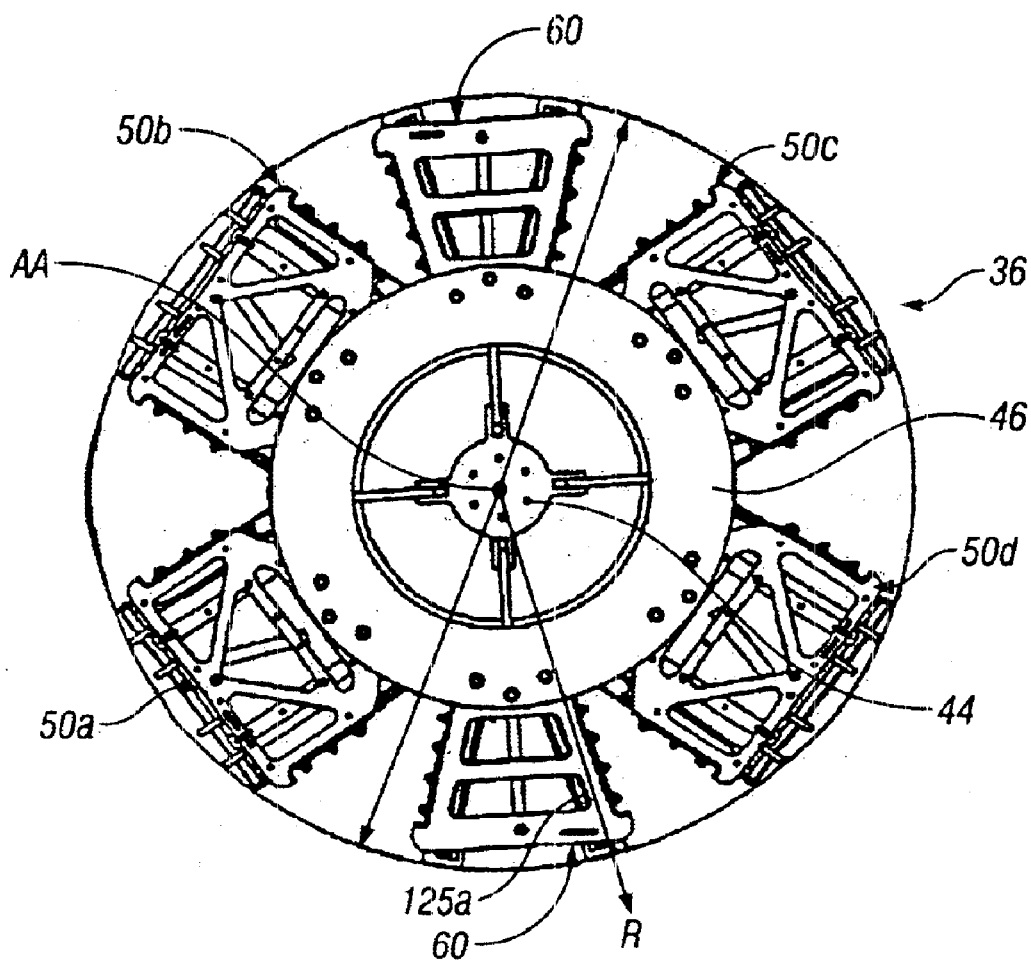
FIG. 3 is a top view of the rotor shown in FIG. 2.

As shown in FIGS. 2 and 3, an even number of box holder assemblies 50a, 50b, 50c, and 50d are symmetrically arranged on a rotor frame 44. Similarly, an even number door holder assemblies 60a and 60b also symmetrically arranged on rotor frame 44. In this system, the box cleaner and methods of use may be the same as described above in U.S. patent application Ser. No. 09/611,642.

Each box holder assembly 50a–50d has the same design and is positioned radially opposite another box holder assembly. Specifically, box holder assembly 50a is positioned radially opposite box holder assembly 50c; and box holder assembly 50b is positioned radially opposite box holder assembly 50d. Similarly, door holder assemblies 60a and 60b are positioned radially opposite each other. Thus the rotor assembly 36 has box holder and door holder assemblies arranged in a symmetrical and rotationally balanced configuration.

The box holder assemblies 50a–50d and door holder assemblies 60a and 60b are attached to the rotor frame 44 and form the rotor assembly 36. The rotor frame 44 includes a top ring plate 46 and a bottom ring plate 48 attached to a core structure 45. The box holder assemblies 50a–50d are rigidly attached to the top and bottom ring plates 46 and 48, preferably via bolts 75.

Figure 4:
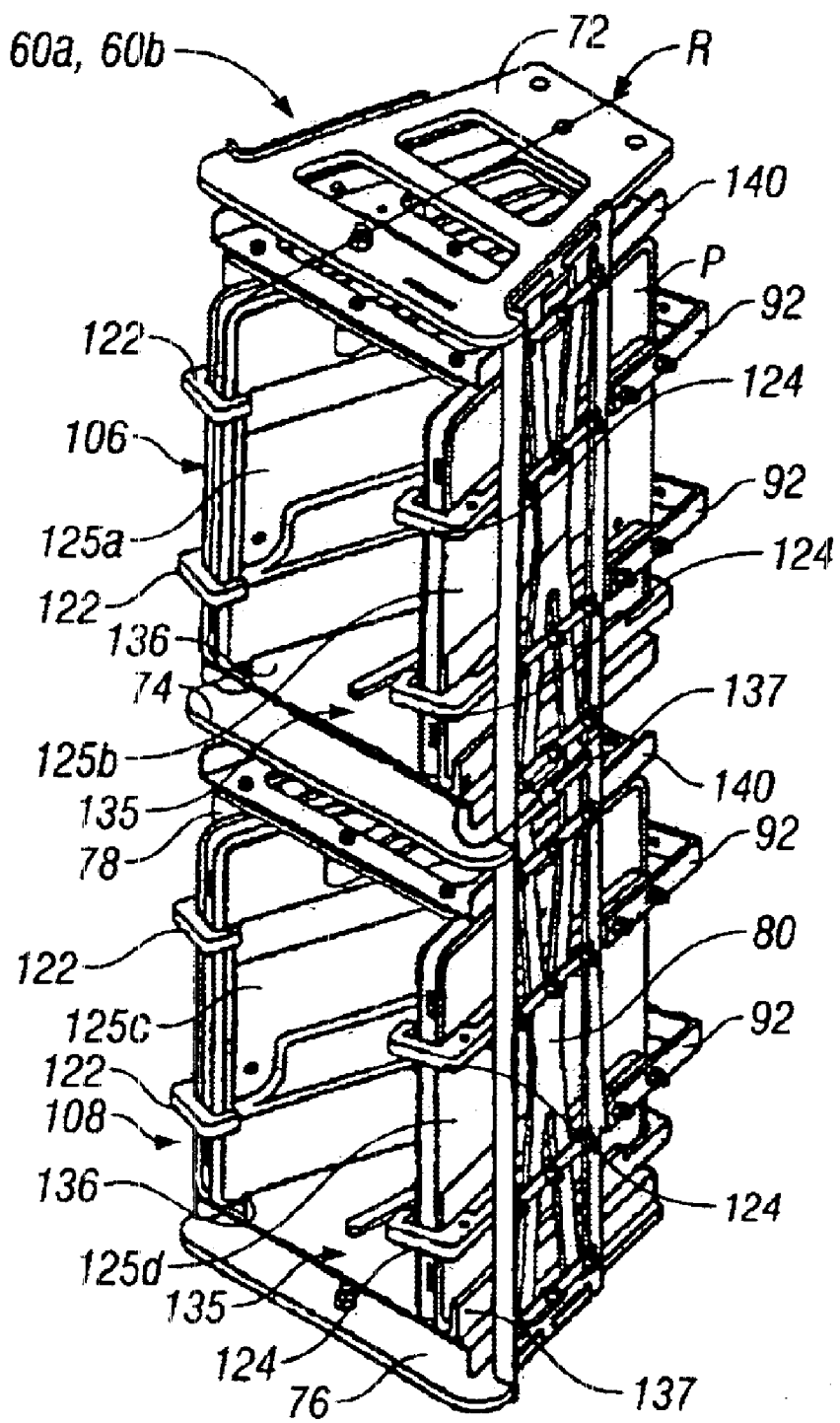
FIG. 4 is a top left side perspective view of a door holder assembly of the rotor of FIGS. 2 and 3.
Figure 5:
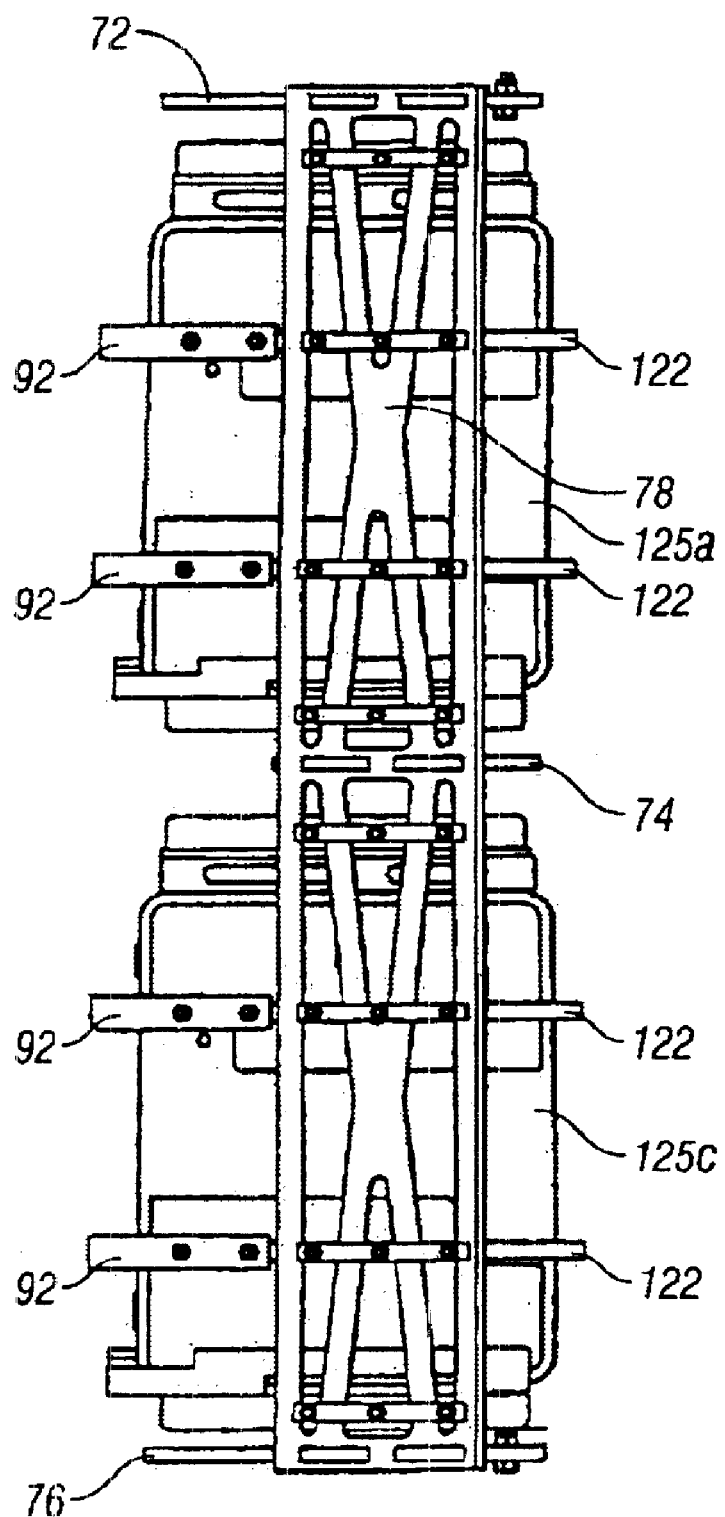
FIG. 5 is a right side elevation view thereof.

Referring to FIG. 4, each door holder assembly 60a and 60b has a top plate 72, a bottom plate 76, a middle plate 74, side plates 78, 80, and arms 92 attached to the side plates. Each door holder assembly 60 is rigidly attached to the top and bottom ring plates 46 and 48 of the rotor frame 44, preferably via bolts 75 extending through the top plate 72 and bottom plate 76 of the door holder assembly.

Each door holder assembly 60a and 60b has an upper compartment 106 and a lower compartment 108, generally separated by the middle plate 74. Referring still to FIG. 4, each of the compartments 106 and 108 has two door holding positions, the top compartment 106 illustrated as holding doors 125a and 125b and the lower compartment illustrated as holding doors 125c and 125d. The door holding positions are preferably mirror images of each other.

Figure 6:
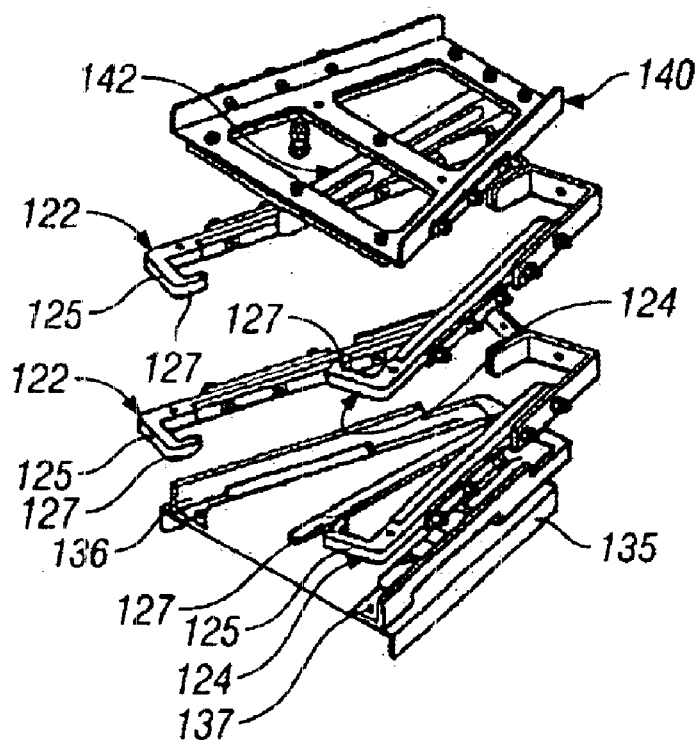
FIG. 6 is an exploded perspective view of the top compartment of the door holder assembly of FIG. 4.
Figure 7:
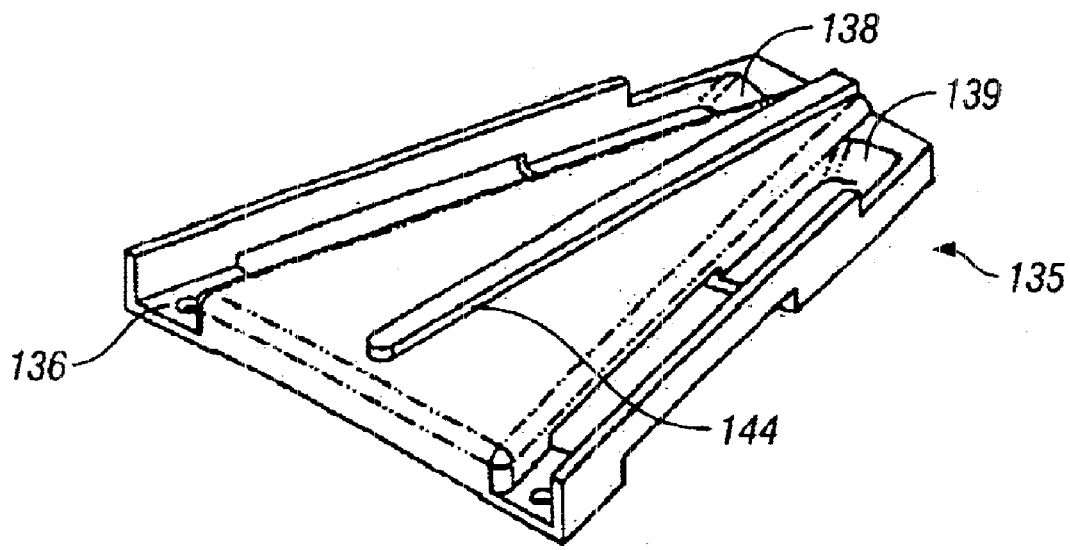
FIG. 7 is a perspective view of the bottom tray of the compartment of FIG. 6.

Referring also now to FIGS. 6 and 7, each compartment 106 and 108 has a bottom surface or tray 135, a pair of left side hooks 122, a pair of right side hooks 124, and a top plate 140. FIG. 6 illustrates details of the compartment elements. FIG. 7 illustrates details of the bottom tray 135. Door slots 136 and 137 are provided in the bottom tray 135, to receive the bottom edges of the doors. The slots 136, 137 are arranged in a radial direction relative to the spin axis AA of the rotor. The slots 136, 137 each include a rear ramp 138 and 139 at the radially inward or back end thereof. Each of the hooks 122 and 124 has a leg 125 and a foot 127 attached to the leg 125. The hooks 122 and 124 are preferably mirror images of each other. The legs 125 extend circumferentially (i.e., in a direction generally tangent to the rotor path of rotation). The feet 127 extend radially inwardly towards the axis of rotation AA of the rotor. The doors are held in the door holders so that they approximately align or are parallel with a radius R of the rotor. The plane P of the broad flat sides of the door is preferably within ±30, 20, or 10 degrees of the radius R, as shown in FIG. 4.

In use, to load doors into the door holder assembly 60, the enclosure door 40 is opened and the rotor assembly is indexed or rotated until the door holder assembly 60a or 60b moves into alignment with the enclosure door 40. The doors 125a–d are then loaded into the door holder assembly 60a or 60b by hand.

When a door (for example door 125a) is installed into the compartment, the bottom of the door 125a fits within the door slot 136. The door slot helps to laterally support the door (e.g., to hold the door against side to side movement). The door (for example door 125a) is installed into the door holder by inserting the door vertically through the opening in the compartment past the slot 136 and past the side hooks 122. The door is then moved laterally into position over the slot 136. The bottom of the door engages the ramp 138 which guides the bottom of the door downwardly and radially outwardly into the slot 136. The radially outward edge of the door also comes into contact with the side hooks 122. Once in the slot 136, the door is moved back radially outwardly until it is engaged by the side hooks 122. The door 125a is then securely positioned and held in place by the hooks, against movement by centrifugal forces exerted by the spinning rotor. Each of the other doors is loaded in the same way. A center guide 144 on the bottom tray 135 helps to guide the inner or back end of the door into the door slot. The doors 125 are unloaded from the door holder assembly 60 using the reverse of the sequence of steps described above.

When loaded into a door holding position, the door is in a vertical position, i.e., one edge of the door is facing the rotor axis A—A and the opposite door edge is facing radially outwardly from the rotor, (and is engaged by the hooks). The plane or face of the door is vertical and perpendicular to the path of movement of the rotor. The plane of one door faces the plane of the adjacent door in the same compartment 106 or 108. The doors are held at the sides of the compartment 106 or 108. The central area of the compartment is empty, to allow space for loading and unloading. The door holder assemblies 60a, 60b are narrower, and occupy a smaller sector of the rotor assembly, than the box holder assemblies.

Using the sequence described above, the door holder assembly 60a, 60b is loaded with doors 125a–d, typically with two doors in the upper compartment 106, and two doors in the lower compartment 108.

The two door holder assemblies 60a, 60b each carry four doors, for a total of eight doors. The rotor assembly 36 has four box holder assemblies 50a–d, each assembly holding two boxes, for a total of eight boxes. As a result, eight boxes and box doors can be cleaned in a single cycle of the cleaning system. The rotor assembly 36 is balanced because the loading is symmetrical about the spin axis AA.

Thus, novel container cleaning systems and methods have been shown and described. Various modifications and substitutions of equivalents may, of course, be made without departing from the spirit and scope of the invention. The invention, therefore, should not be restricted, except by the following claims, and their equivalents.

While the rotor is described here with four box holder assemblies, and two door holder assemblies, each having two compartments (upper and lower) other members and configurations made also be used.

What is claimed is:

1. A system for cleaning boxes used for holding flat media substrates, with each box each having a door, comprising:
   a rotor;
   first and second box holder assemblies positioned symmetrically on opposite sides of the rotor, each box holder assembly having at least one box holding position; and
   first and second box door holder assemblies positioned symmetrically on opposite sides of the rotor, with each door holder assembly having at least one door holding position.

2. The system of claim 1 with the first box door holder assembly comprising a first pair of hooks at a first side of the box door holder assembly, and a second pair of hooks at a second side of the box door holder assembly.

3. The system of claim 2 wherein each of the hooks comprises a leg and a foot attached to the leg.

4. The system of claim 3 wherein the legs of each pair of hooks extend towards each other.

5. The system of claim 4 wherein the foot of each pair of hooks extends radially inwardly towards an axis of rotation of the rotor.

6. The system of claim 1 where the first box door holding assembly has first and second spaced apart box door holding positions, for holding box doors in a vertical position.

7. The system of claim 1 with at least one of the first and second door holder assemblies further comprising a centrally located guide on a bottom surface of the door holder assembly.

8. The system of claim 1 wherein the first door holder assembly holds a door with an upper and a lower edge of the door aligned on a radius of the rotor.

9. The system of claim 1 wherein each box holder assembly includes two positions for holding boxes.

10. The system of claim 1 wherein each door holder assembly includes four positions for holding box doors.

11. The system of claim 1 wherein each box door position includes an upper door hook, a lower door hook, and a bottom slot for accepting a bottom edge of a box door.

12. The system of claim 11 wherein the slot includes a ramp at one end thereof.

13. The system of claim 1 wherein the door holder assembly comprises a left side plate and a right side plate attached to a top plate, a middle plate and a bottom plate, forming a upper compartment and a lower compartment, and wherein each compartment having a plurality of sets of upper and lower door hooks and a plurality of bottom slots.

14. The system of claim 13 wherein a left upper and a left lower door hook is attached to the left side plate, and a right upper and right lower door hook is attached to the right side plate.

15. The system of claim 14, wherein the box door is restrained against movement via centrifugal force holding an outer edge of the door with at least one door hook.

16. The system of claim 13 wherein when positioned in a bottom slot, a box door is arranged in a vertical plane parallel to a radius of the rotor.

17. The system of claim 1 further comprising an enclosure, with the rotor rotatably mounted within the enclosure, and with a plurality of spray nozzles within the enclosure positioned to spray a fluid towards the rotor.

18. A system for cleaning boxes used for holding flat media substrates and doors of the boxes, comprising:

a rotor;

a door holder assembly on the rotor, with the door holder including:

upper and lower left side hooks and upper and lower right side hooks horizontally spaced apart from the upper and lower left side hooks;

with each of the hooks having a leg extending towards a central area of the door holder assembly, and with each of the hooks having a foot attached to the leg and extending inwardly towards an axis of rotation of the rotor.

19. A system for cleaning boxes used for holding flat media substrates, with each box each having a door, comprising:

a rotor;

first and second box holding means positioned symmetrically on opposite sides of the rotor, for holding boxes; and first and second door holding means positioned symmetrically on opposite sides of the rotor, for holding doors of the boxes.

* * * * *